United States Patent [19]

Lee et al.

[11] Patent Number: 5,037,773
[45] Date of Patent: Aug. 6, 1991

[54] STACKED CAPACITOR DOPING TECHNIQUE MAKING USE OF RUGGED POLYSILICON

[75] Inventors: Ruojia Lee; Fernando Gonzalez, both of Boise, Id.

[73] Assignee: Micron Technology, Inc., Boise, Id.

[21] Appl. No.: 612,296

[22] Filed: Nov. 8, 1990

[51] Int. Cl.⁵ ............................................ H01L 21/72
[52] U.S. Cl. ..................................... 437/60; 437/164; 437/919; 437/977; 148/DIG. 133
[58] Field of Search ............... 437/977, 967, 919, 164, 437/160, 47, 60; 148/DIG. 138, DIG. 122, DIG. 14, DIG. 1, DIG. 133; 357/23.6

[56] References Cited

U.S. PATENT DOCUMENTS

| | | | |
|---|---|---|---|
| 4,536,950 | 8/1985 | Sadamatsu et al. | 437/164 |
| 4,549,914 | 10/1985 | Oh | 437/160 |
| 4,742,018 | 5/1988 | Kimura et al. | 437/919 |
| 4,874,716 | 10/1989 | Rao | 437/919 |

OTHER PUBLICATIONS

"Chemically Vapor-Deposited Borophosphosilicate Glasses for Silicon Device Applications", RCA Review, vol. 43, Sep. 1982, pp. 423–457, by Werner Kern and George L. Schnable.

Primary Examiner—Brian E. Hearn
Assistant Examiner—C. Chaudhari
Attorney, Agent, or Firm—David J. Paul; Stanley N. Protigal

[57] ABSTRACT

A technique for effectively doping a storage node capacitor plate constructed from low temperature deposited rugged polysilicon. A phosphorus silica glass is deposited prior polysilicon deposition and used primarily to uniformly diffuse n-type dopants into the subsequently deposited rugged poly capacitor plate. This doping technique eliminates the need for high temperature doping and will maintain the rugged surface in the poly of the capacitor plate.

16 Claims, 2 Drawing Sheets 5,037,773

STACKED CAPACITOR DOPING TECHNIQUE MAKING USE OF RUGGED POLYSILICON

FIELD OF THE INVENTION

This invention relates to semiconductor circuit memory storage devices and more particularly to a rugged polysilicon doping process implemented in the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of denser memory array devices are to be successfully manufactured.

One important and very effective approach has been by increasing a storage-node cell plate surface area by depositing a rugged surface polysilicon (rugged poly) to serve as the storage-node cell plate. Although rugged poly can effectively double the storage-node cell plate, its deposition and conductive doping presents unique problems that require special considerations.

The unique problems that arise when processing rugged poly stems from the low temperature (approximately 570° C.) required to create the rugged surface area as the poly is being deposited and the nature of the rugged topology itself.

An approximate temperature of 570° C. is required to maintain the optimal rugged surface of the poly. Despite this, a conventional subsequent step of conductively doping the poly plate requires using a relatively high temperature. This temperature is in the neighborhood of 800° C. to obtain a fairly uniform penetration of dopants into even a smooth surfaced poly.

The rugged surface makes it even more difficult to obtain uniform doping and thus requires even a higher temperature then normal. A problem with this is the doping at such a high temperature causes the rugged poly surface to become virtually smooth as the temperature approaches 600° C., thus losing the advantage created by the rugged poly in the first place.

It is these problems of maintaining a rugged poly capacitor plate surface while achieving successful uniform conductive doping of the rugged poly that the present invention addresses.

SUMMARY OF THE INVENTION

The invention is directed to a polysilicon conductive doping technique for use in a semiconductor fabrication process. This technique is particularly utilized during a stacked capacitor fabrication process which uses rugged polysilicon as a capacitor cell plate, to maximize storage cell surface area in a high density/high volume DRAM (dynamic random access memory) fabrication process.

After a silicon wafer is prepared using conventional process steps up to the point of depositing polysilicon to be used as a capacitor plate, the present invention teaches an effective method to conductively dope, in a uniform manner, the capacitor's rugged polysilicon plate while maintaining the optimal rugged poly topology.

DETAILED DESCRIPTION OF THE PREFERRED EMBODIMENT

Figure 1:
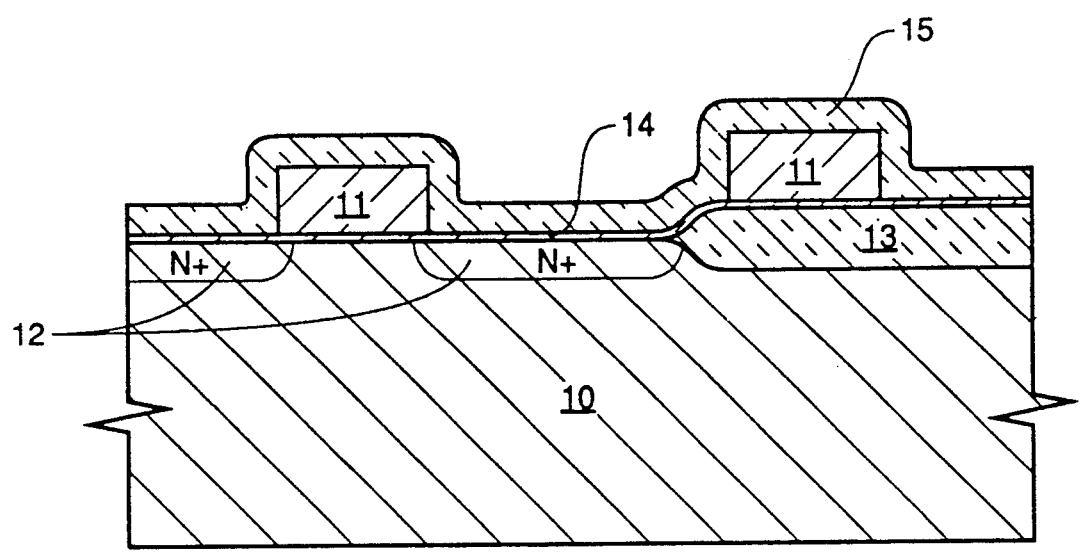
FIG. 1 shows a cross-sectional view of a buried contact location following blanket depositions of oxide and phosphorus silica glass.
Figure 2:
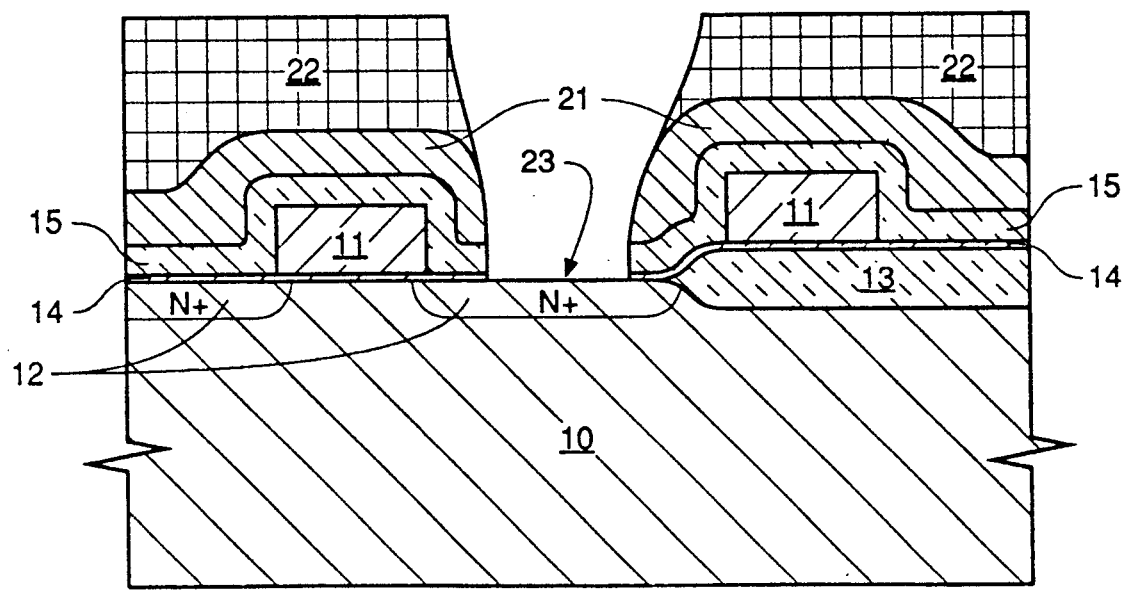
FIG. 2 shows a cross-sectional view of a buried contact location following a buried contact etch.
Figure 3:
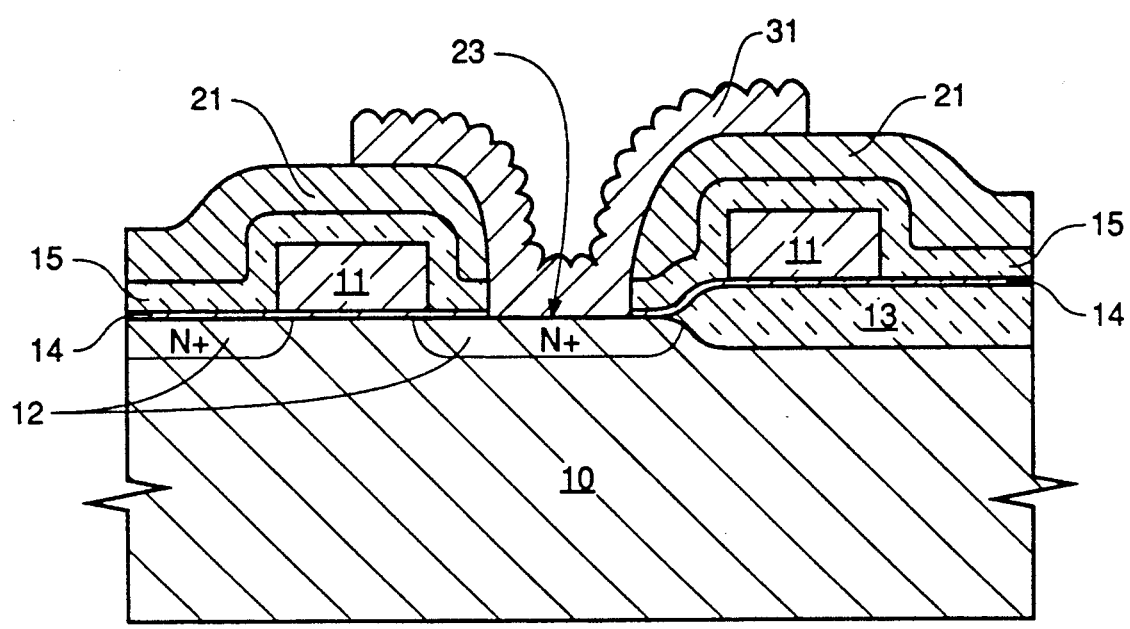
FIG. 3 shows a cross-sectional view of a buried contact location following a blanket deposition of conformal rugged poly and a subsequent storage-node patterning and etching of the conformal poly.

The invention is directed to a polysilicon conductive doping technique employed during a stacked capacitor fabrication process which, in preferred embodiment, uses rugged polysilicon as a capacitor cell plate, in a high density/high volume DRAM (dynamic random access memory) fabrication process, in a sequence shown in FIGS. 1-3.

A silicon wafer is prepared using conventional process steps up to the point of defining a cell array. Fabrication of a storage node capacitor plate will now follow.

The capacitor of each cell will make contact via a buried contact within the cell. Each active area within the array is isolated from one another by a thick field oxide and arranged in interdigitated columns and non-interdigitated rows. The active areas are used to form active MOS transistors which, for the present invention, must be doped as n-type conductivity to form NMOS type FETs. Each active area has a section defined for an access junction and a storage node junction bridged by a conductive word that serves as a gate for each NMOS transistor fabricated.

FIG. 1 shows a cross-sectional view of an in-process wafer 10 having active areas 12 being conductively doped as n-type. Oxide 13 has been deposited and patterned to provide isolation between each access device, wherein each access device comprises active areas 12 covered with a thin gate oxide 14 and bridged by a polysilicon patterned word line (not shown) serving as a gate of the NMOS type transistor access device. Parallel patterned polysilicon digit lines connect to a digit line junction of each active area via a buried contact (also not shown). A conformal dielectric layer, such as oxide is then deposited.

As shown in FIG. 2, a conformal layer of dielectric 21 with n-type dopants impurities, preferably phosphorus silica glass (PSG), is deposited, followed by a blanket covering of photoresist 22. Photomasking and etching allows access to active area 12 for use as a future buried contact 23 location.

As shown in FIG. 3, a conformal layer of semiconductive material polysilicon 31 has been deposited by low temperature chemical vapor deposition, resulting in a poly having a rugged textured surface. The preferred temperature setting should be approximately 570° C.

Poly 31 is and subsequently patterned to form a storage-node capacitor plate 31. Because of a high concentration of phosphorus in PSG dielectric 21, n-type dopants diffuse into poly plate 31 causing poly plate 31 to retain an n-type conductivity doping. Dielectric 21 could also be a glass containing p-type dopant impurities, such as boron phosphorus silica glass (BPSG), that would cause poly 31 to be conductively doped as p-type.

Conventional methods of completing a storage cell capacitor, such as depositing a cell dielectric and a top doped polysilicon cell plate common to all storage cells of a DRAM array, are continued from here on.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a capacitor for a storage cell within a DRAM array on a silicon substrate, said process comprising:
   a) creating a conductively-doped digit line junction and storage node junction, within active areas on opposite sides of a word line;
   b) depositing a first dielectric layer superjacent said substrate having said digit line and storage node junctions;
   c) creating first aligned buried contact locations at said digit line junctions in said active areas;
   d) depositing a first conductive layer superjacent said substrate surface, said first conductive layer making direct contact to said digit line junctions at said first buried contact locations;
   e) depositing a second dielectric layer superjacent to said first conductive layer;
   f) masking and etching said first conductive layer and said second dielectric layer to form a plurality of parallel conductive digit lines aligned along columns such that a digit line makes electrical contact at digit line junctions within a column, said digit lines running perpendicular to and over said word lines forming a three-dimensional, waveform-like topology having an array surface;
   g) depositing a third dielectric layer superjacent said array surface of said waveform-like topology;
   h) depositing a subsequent dielectric layer containing a first dopant type, superjacent said third dielectric layer;
   i) creating a second aligned buried contact location at said storage node junctions in said active areas;
   j) depositing a second conductive layer superjacent said array surface, whereby the second conductive layer assumes said waveform-like topology in response to existing topology, said second conductive layer making contact to said storage node junctions at said second buried contact locations;
   k) doping said second conductive layer via said previously deposited doped dielectric;
   l) patterning said second conductive layer to form storage node plates at said storage node junctions;
   m) depositing a cell dielectric layer adjacent and coextensive with said storage node plates and adjacent said array surface; and
   n) depositing a third conductive layer adjacent and coextensive with said cell dielectric layer to form a cell plate common to the entire memory array.

2. A process as recited in claim 1, wherein said digit line junction and storage node junction are doped as n-type conductivity.

3. A process as recited in claim 1, wherein said first, said second and said third dielectric layers ar oxide.

4. A process as recited in claim 1, wherein said first and said second buried contacts are self-aligned.

5. A process as recited in claim 1, wherein said first, said second and said third conductive layers are doped polysilicon.

6. A process as recited in claim 1, wherein said second conductive layer is deposited by low temperature deposition comprising chemical vapor deposition at a temperature of approximately 570° C.

7. A process as recited in claim 1, wherein said first dopant type is n-type.

8. A process as recited in claim 1, wherein said doped dielectric is phosphorus silica glass.

9. A process as recited in claim 1, wherein said cell dielectric is nitride.

10. A process for fabricating a capacitor for a storage cell within a DRAM array on a silicon substrate, said process comprising:
   a) creating a conductively-doped digit line junction and storage node junction, within active areas on opposite sides of a word line;
   b) depositing a first dielectric layer superjacent said substrate having said digit line and storage node junctions;
   c) creating first aligned buried contact locations at said digit line junctions in said active areas;
   d) depositing a first conductive layer superjacent said substrate surface, said first conductive layer making direct contact to said digit line junctions at said first buried contact locations;
   e) depositing a second dielectric layer superjacent to said first conductive layer;
   f) masking and etching said first conductive layer and said second dielectric layer to form a plurality of parallel conductive digit lines aligned along columns such that a digit line makes electrical contact at digit line junctions within a column, said digit lines running perpendicular to and over said word lines forming a three-dimensional, waveform-like topology having an array surface;
   g) depositing a third dielectric layer superjacent said array surface of said waveform-like topology;
   h) depositing a phosphorus silica glass layer superjacent said third dielectric layer;
   i) creating a second aligned buried contact location at said storage node junctions in said active areas;
   depositing a second conductive layer superjacent said array surface, whereby the second conductive layer assumes said waveform-like topology in response to existing topology, said second conductive layer making contact to said storage node junctions at said second buried contact locations;
   k) doping said second conductive layer via said previously deposited phosphorus silica glass;
   l) patterning said second conductive layer to form storage node plates at said storage node junctions;
   m) depositing a cell dielectric layer adjacent and coextensive with said storage node plates and adjacent said array surface; and
   n) depositing a third conductive layer adjacent to and coextensive with said cell dielectric layer to form a cell plate common to the entire memory array.

11. A process as recited in claim 10, wherein said digit line junction and storage node junction are doped as n-type conductivity.

12. A process as recited in claim 10, wherein said first, said second and said third dielectric layers are oxide.

13. A process as recited in claim 10, wherein said first and said second buried contacts are self-aligned.

14. A process as recited in claim 10, wherein said first, said second and said third conductive layers are doped polysilicon.

15. A process as recited in claim 10, wherein said second conductive layer is deposited by low temperature deposition comprising chemical vapor deposition at a temperature of approximately 570° C.

16. A process as recited in claim 10, wherein said cell dielectric is nitride.

* * * * *